United States Patent
Lee et al.

(10) Patent No.: US 7,917,040 B2
(45) Date of Patent: Mar. 29, 2011

(54) METHOD AND APPARATUS FOR CONTROLLING WAVELENGTH TUNING OF OPTICAL SOURCE FOR OPTICAL COMMUNICATION

(75) Inventors: Jyung Chan Lee, Daejeon (KR); Moo Jung Chu, Daejeon (KR); Kwang Joon Kim, Daejeon (KR); Jun Ki Lee, Daejeon (KR)

(73) Assignee: Electronics & Telecommunications Research Institute, Daejeon (KR)

( * ) Notice: Subject to any disclaimer, the term of this patent is extended or adjusted under 35 U.S.C. 154(b) by 721 days.

(21) Appl. No.: 11/871,357

(22) Filed: Oct. 12, 2007

(65) Prior Publication Data

US 2008/0107431 A1    May 8, 2008

(30) Foreign Application Priority Data

Nov. 8, 2006  (KR) .................. 10-2006-0110080
Mar. 5, 2007  (KR) .................. 10-2007-0021585

(51) Int. Cl.
  *H04B 10/04* (2006.01)
(52) U.S. Cl. ........ 398/196; 398/192; 372/34; 372/38.07
(58) Field of Classification Search ................ 398/196, 398/195, 194, 193; 372/34, 38.07, 38.02
  See application file for complete search history.

(56) References Cited

U.S. PATENT DOCUMENTS 6,369,926 B1 * 4/2002 Lyu et al. .................. 398/95

FOREIGN PATENT DOCUMENTS

| JP | 2001-326569 | 11/2001 |
| KR | 2004-0022578 | 3/2004 |
| KR | 2005-0037344 | 4/2005 |
| KR | 2006-0040004 | 5/2006 |

OTHER PUBLICATIONS

Pump-Wavelength-Locked Erbium-Doped Fibre Amplifier Employing Novel External Cavity for 0.98μm Laser Diode, H. Masuda et al., Electronics Letters Sep. 24, 1992, vol. 28 No. 20, p. 1855-1857.
Widely Tunable Micromachined Detectors With Wavelength Tracking, E. C. Vail et al., Lasers and Electro-Optics Society Annual Meeting, 1995. 8th Annual Meeting Conference Proceedings, vol. 2, p. 303-304.
A Multi-wavelength Locker for WDM System, K. J. Park et al., Optical Fiber Communication Conference, 2000 vol. 2, p. 73-75.
Simultaneous laser wavelength locking and spectral filtering using fiber Bragg grating Shtengel, G.E. et al., Semiconductor Laser Conference, 1998. ISLC 1998 NARA. 1998 IEEE 16th International, p. 269-270.

* cited by examiner

*Primary Examiner* — M. R. Sedighian
(74) *Attorney, Agent, or Firm* — Rabin & Berdo, P.C.

(57) ABSTRACT

A method and apparatus for controlling a wavelength tuning of an optical source in an optical communication system. An operating temperature of an optical source is controlled and monitored to shorten a wavelength tuning time of the optical source generated in an optical source generator. When the current operating temperature reaches a final target temperature, an operating current is supplied to the optical source generator, and transmission of the operating current to the optical source generator is controlled and monitored. When the operating current reaches a final operating current, the wavelength tuning of the optical source is terminated. The operating temperature is adjusted by distinguishing between a smaller amount of temperature change and a larger amount of temperature change to prevent oscillation at the point of reaching the final target temperature, thereby minimizing the time taken for the output wavelength tuning.

14 Claims, 6 Drawing Sheets

METHOD AND APPARATUS FOR CONTROLLING WAVELENGTH TUNING OF OPTICAL SOURCE FOR OPTICAL COMMUNICATION

CLAIM OF PRIORITY

This application claims the benefit of Korean Patent Application Nos. 2006-110080 filed on Nov. 8, 2006 and 2007-21585 on Mar. 5, 2007 in the Korean Intellectual Property Office, the disclosures of which are incorporated herein by reference.

BACKGROUND OF THE INVENTION

1. Field of the Invention

The present invention relates to an apparatus and a method for controlling a wavelength tuning of an optical source in an optical communication system and, more particularly, to an apparatus and a method for controlling a wavelength tuning of an optical source in an optical communication system, which minimizes a wavelength tuning time of an optical source.

This work was supported by the IT R&D program of MIC/IITA [2006-S-059-01, ASON based Metro Photonic Cross-Connect Technology]

2. Description of the Related Art

In a configuration of an optical communication system, wavelength utilization is maximized through wavelength division multiplexing in which a plurality of signals are divided into a plurality of wavelengths and transmitted to a thread of optical fiber, which is a transmission line. The transmission signal of such an optical communication system is transferred to a remote place through the transmission line configured in multiple stages of transmission blocks. These multiple blocks assist transmission to another network with optical signal add/drop function. To allow such optical signal add/drop function, there should not be collision between the wavelengths of optical signals in connecting the networks. Thus, technologies of wavelength tuning of an optical source at fixed wavelengths are required. The wavelength of an optical source can be tuned by various methods according to the structural condition of the optical source and the width of a wavelength tuning band.

One of the apparatuses for generating an optical source can be a laser diode, and according to the structure of the optical source, wavelength of the optical source of the laser diode can be utilized to widen a wavelength tuning band.

Technologies are currently under development to execute wavelength tuning at stable and high speeds. In particular, the time of wavelength tuning needs to be shortened, but conventionally, the focus has been the configuration of surrounding circuits for wavelength tuning. Thus, the conventional technology does not shorten but rather may lengthen the overall wavelength tuning time. Therefore, there exists a need for an effective method that allows stable optical communication while minimizing the wavelength tuning time.

SUMMARY OF THE INVENTION

The present invention has been made to solve the foregoing problems of the prior art and therefore an aspect of the present invention is to provide a method and an apparatus for controlling a wavelength tuning, which minimize a wavelength tuning time of an optical source in an optical communication system.

Another aspect of the invention is to provide an apparatus and a method for controlling a wavelength tuning, which minimize the time taken for tuning an output wavelength of a laser diode by adjusting an operating temperature of the laser diode through a thermoelectric cooler of the laser diode generating an optical source.

According to an aspect of the invention, the invention provides a method of controlling a wavelength tuning of an optical source in an optical communication system. The method includes controlling and monitoring an adjustment of an operating temperature of an optical source generator to shorten a time of the wavelength tuning of the optical source generated from the optical source generator of the optical communication system; supplying an operating current to the optical source generator if a current operating temperature of the optical source generator reaches a final target temperature; controlling and monitoring the supply of the operating current to the optical source generator; and halting the wavelength tuning of the optical source when the operating current reaches a final operating current.

According to another aspect of the invention, the invention provides an apparatus for controlling a wavelength tuning of an optical source in an optical communication system. The apparatus includes an optical source generator for generating an optical source and adjusting an operating temperature and an operating current in accordance with a control signal; and a control circuit for generating the control signal for adjusting the operating temperature and the operating current of the optical source generator, monitoring the operating temperature and the operating current to shorten a time of wavelength tuning of the optical source, and supplying the operating current to the optical source generator when a current operating temperature of the optical source generator reaches a final target temperature.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. In the drawings, the same reference numerals are used throughout to designate the same or similar components. In the following description, well-known functions and constructions are not described in detail since they would obscure the invention in unnecessary detail.

An exemplary embodiment of the present invention applies to a laser diode for generating an optical source in an optical communication system, and particularly, to a narrow-band wavelength tunable laser diode, in which an operating temperature is adjusted to tune the output light wavelength in a band of 3.5 nm. An apparatus for tuning the wavelength of the optical source generated from such a laser diode will be described in detail with reference to the accompanying drawings.

Figure 1:
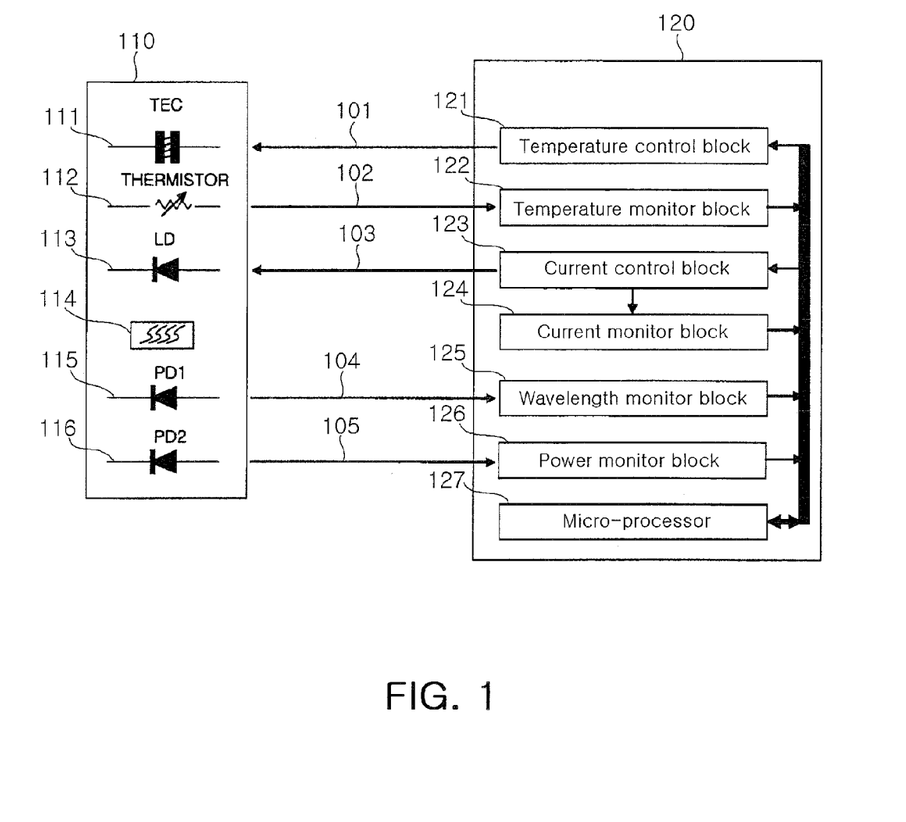
FIG. 1 is a configuration view illustrating an apparatus for controlling a wavelength tuning of an optical source of an optical communication system according to an embodiment of the present invention.

FIG. 1 is a configuration view illustrating an apparatus for controlling a wavelength tuning of an optical source for optical communication in an optical communication system, according to an embodiment of the present invention.

Referring to FIG. 1, the apparatus for controlling a wavelength tuning includes an optical source generator 110 for generating an optical source and a control circuit 120 for controlling the optical source generator 110. Here, circuit patterns 101 to 105 are connecting respective devices 121 to 127 in the control circuit 120 with the optical source generator in order to monitor and control an operating temperature and an operating current of the devices 121 to 127.

The optical source generator 110 includes a Thermoelectric Cooler (TEC) 111, a thermistor 112, a laser diode 113, an etalon filter 114, a first photo diode PD1 115 and a second photo diode PD2 116.

The thermistor 112 is a functional device varying in electric resistance value according to temperature, and the etalon filter 114 is a functional device which filters a portion of output light of the laser diode 113 to change the light amount dependent on the wavelength of light.

The first photo diode PD1 115 is a device for converting the light filtered through the etalon filter 114 into an electric signal, and the second photo diode PD2 116 is a device for converting a portion of the output light from the laser diode 113 into an electric signal to monitor the intensity of light of the laser diode.

The control circuit 120 has functions of adjusting an operating temperature to vary and stabilize the wavelength of the output light of the optical source generator 110 and of adjusting and stabilizing the intensity of output light of the optical source generator 110. In accordance with these functions, the control circuit 120 can include a temperature control block 121, a temperature monitor block 122, a current control block 123, a current monitor block 124, a wavelength monitor block 125, a power monitor block 126 and a micro-processor 127.

The temperature control block 121 flows a current to adjust the operating temperature of the laser diode.

The temperature monitor block 122 monitors the resistance change of the thermistor 112 to monitor the operating temperature of the optical source generator 110.

The current control block 123 controls the operating current of the optical source generator 110, and the current monitor block 124 monitors the operating current of the optical source generator 110.

The wavelength monitor block 125 receives a signal from the first photo diode PD1 115 to monitor the wavelength tuning and reports the monitor result to the micro-processor.

The power monitor block 126 receives a signal from the second photo diode PD2 116 of the optical source generator 110 to monitor power and reports the monitor result to the micro-processor.

The micro-processor 127 comprehensively controls and monitors the functions of other components inside the control circuit 120, and may include a memory, an operator, an analog/digital converter and a digital/analog converter.

Now, a method of controlling a wavelength tuning of an optical source in the apparatus for controlling wavelength tuning with the above described configuration will now be described in detail with reference to accompanying drawings.

First, the operation for tuning the wavelength of the output light of the laser diode will be explained.

Figure 2:
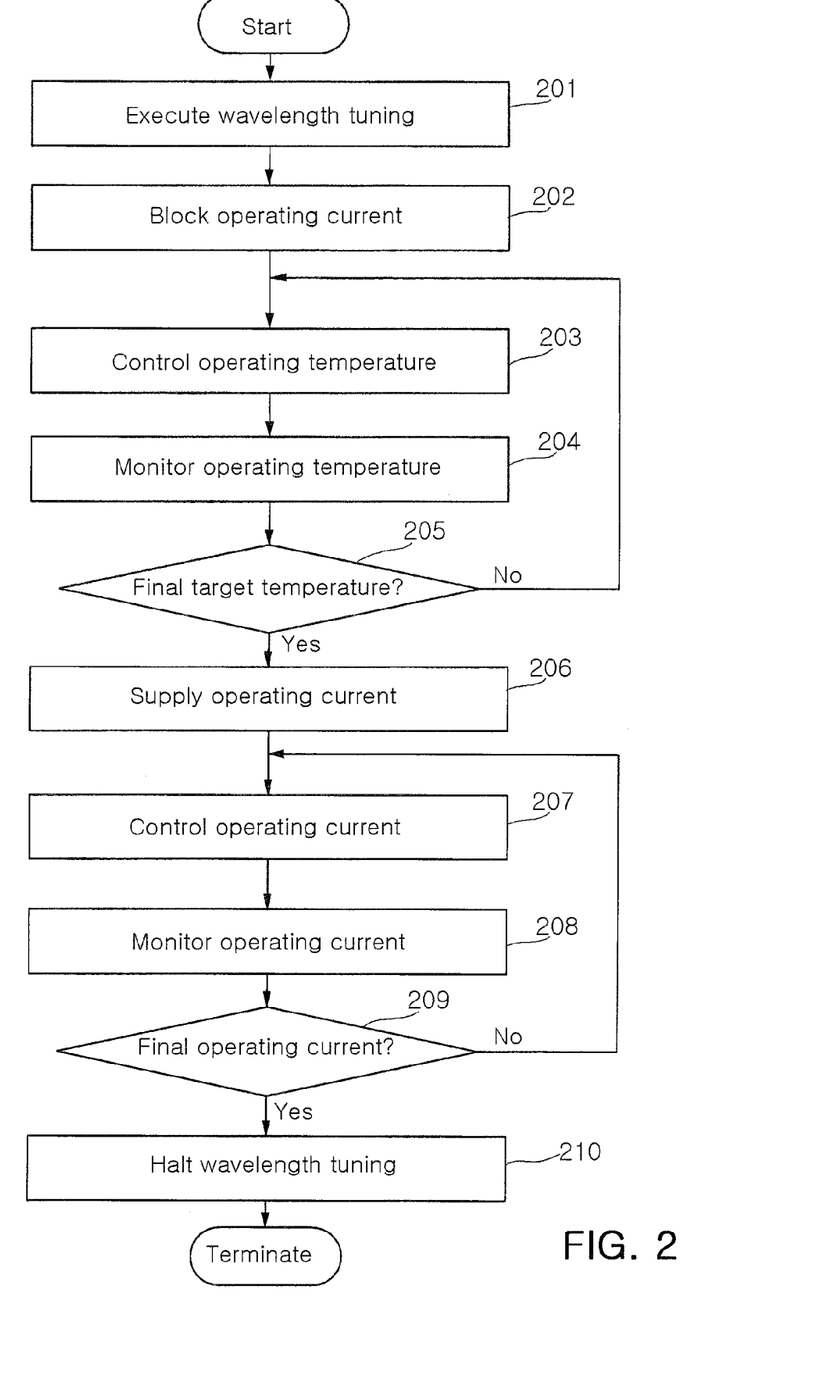
FIG. 2 is a flowchart illustrating a process of tuning a light wavelength of a laser diode according to an embodiment of the present invention.

FIG. 2 is a flowchart illustrating a process of tuning the wavelength of the light of the laser diode according to an embodiment of the present invention.

Referring to FIG. 2, in the apparatus for controlling the wavelength tuning, the micro-processor 127 starts tuning the wavelength of the laser diode in step 201, and controls the current control block 123 to transmit a current control signal to the optical source generator 110, thereby blocking the current in step 202.

Then, the micro-processor 127 controls the temperature control block 121 to transmit a temperature control signal to the optical source generator 110 in step 203. Thereby, the optical source generator 110 adjusts the thermo-electric cooler 111 according to the temperature control signal to regulate the temperature of the laser diode 113. Then, in step 204, the optical source generator 110 monitors a current operating temperature of the laser diode 113 through the thermistor 112 to transmit a temperature monitor signal indicating the current operating temperature.

Then, in step 205, the micro-processor 127 checks on the temperature monitor signal received at the temperature monitor block 122 from the optical source generator 110 to find the current temperature of the laser diode 113. Then, the microcontroller 127 checks whether the currently checked operating temperature is at a final target temperature or not, and if not, the micro-processor 127 controls the temperature control block 121 to transmit the temperature control signal to the optical source generator 110 back in the step 203, and the above steps after the step 203 are repeated.

On the contrary, after checking at the step 205, if the current operating temperature is at the final target temperature, the micro-processor 127 supply an operating current to the optical source generator 110 by controlling the current control block 123 in step 206. Thereby, the optical source generator 110 is driven by the current to generate an optical source from the laser diode 113. Then, in step 207, the micro-processor 127 transmits a current control signal to the optical source generator 110 through the current control block 124 and controls the present operating current of the laser diode 113 by transmitting the current control signal.

Then, in step 208, the micro-processor 127 receives from the current monitor block 124 the result of monitoring the operating current in accordance with the signal from the current control block 123 and checks the current operating temperature. At this time, in step 209, the micro-processor 127 checks whether the current operating current is at a final operating current, and if so, the process flow goes back to the step 207 and the above steps after the steps 207 are repeated. At this time, the first photo diode PD1 115 of the optical source generator 110 converts a portion of the light passed through the etalon filter 114 into an electric signal to monitor the wavelength of light, and the second photo diode PD2 116 converts a portion of output light from the laser diode 113 into an electric signal to monitor the light intensity. Thereby, the micro-processor 127 monitors a wavelength monitor signal and a light intensity signal outputted, respectively, from the first and second photo diodes 116 and 117 via the wavelength monitor block 125 and the power monitor block 126, respectively, to check the current wavelength and intensity (power) of light of the laser diode 113.

On the other hand, after checking at the step 209, if the current operating current is at the final operating current, the micro-processor 127 halts the wavelength tuning in step 210.

Figure 3:
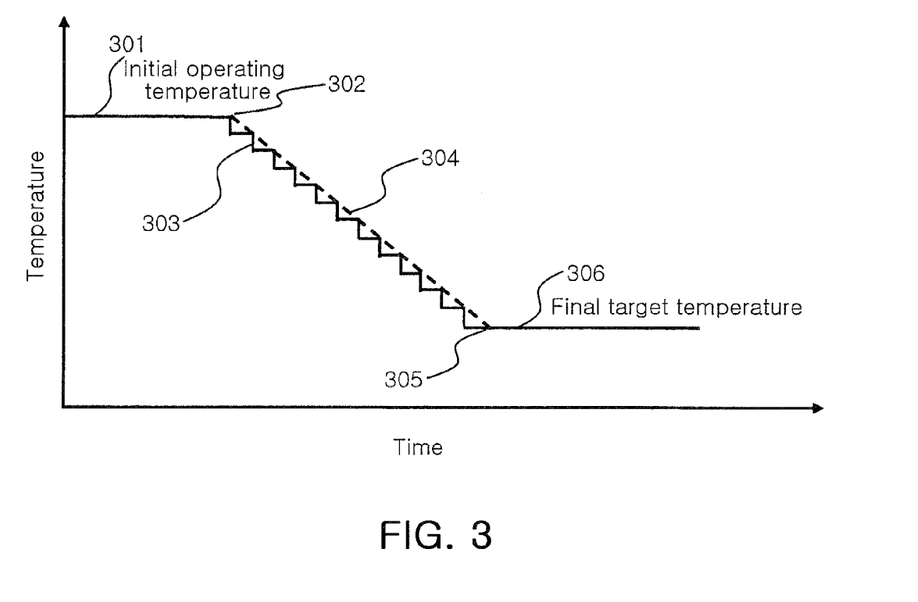
FIG. 3 is a graph illustrating control and monitoring results of the operating temperature according to time, obtained from the operation of the laser diode according to an embodiment of the present invention.

The results obtained from the process of tuning the wavelength of the laser diode are as shown in the graph illustrating the control and monitor of the operating temperature according to time in FIG. 3.

The graph in FIG. 3 shows the results obtained by repeating the procedure of controlling and monitoring the operating temperature and the operating current through the process shown in FIG. 2, in which the control of the operating temperature and the operating current starts at an initial operating temperature 301, and the wavelength tuning time from the point 302 to the point 305 is shortened. Here, the point 302 is a starting point of controlling the operating temperature, corresponding to the step 203 in FIG. 2, the point 303 corresponds to implementation of the steps 201, 204 and 205 in FIG. 2, and the point 304 is the point of monitoring the current operating temperature corresponding to the step 205 in FIG. 2. The point 305 indicates the point where the current temperature is monitored to match the final target temperature 306, thus entailing execution of the step 206. The operation of shortening the wavelength tuning time from the points 302 to 305 will be explained in detail with reference to the accompanying drawings.

Figure 4:
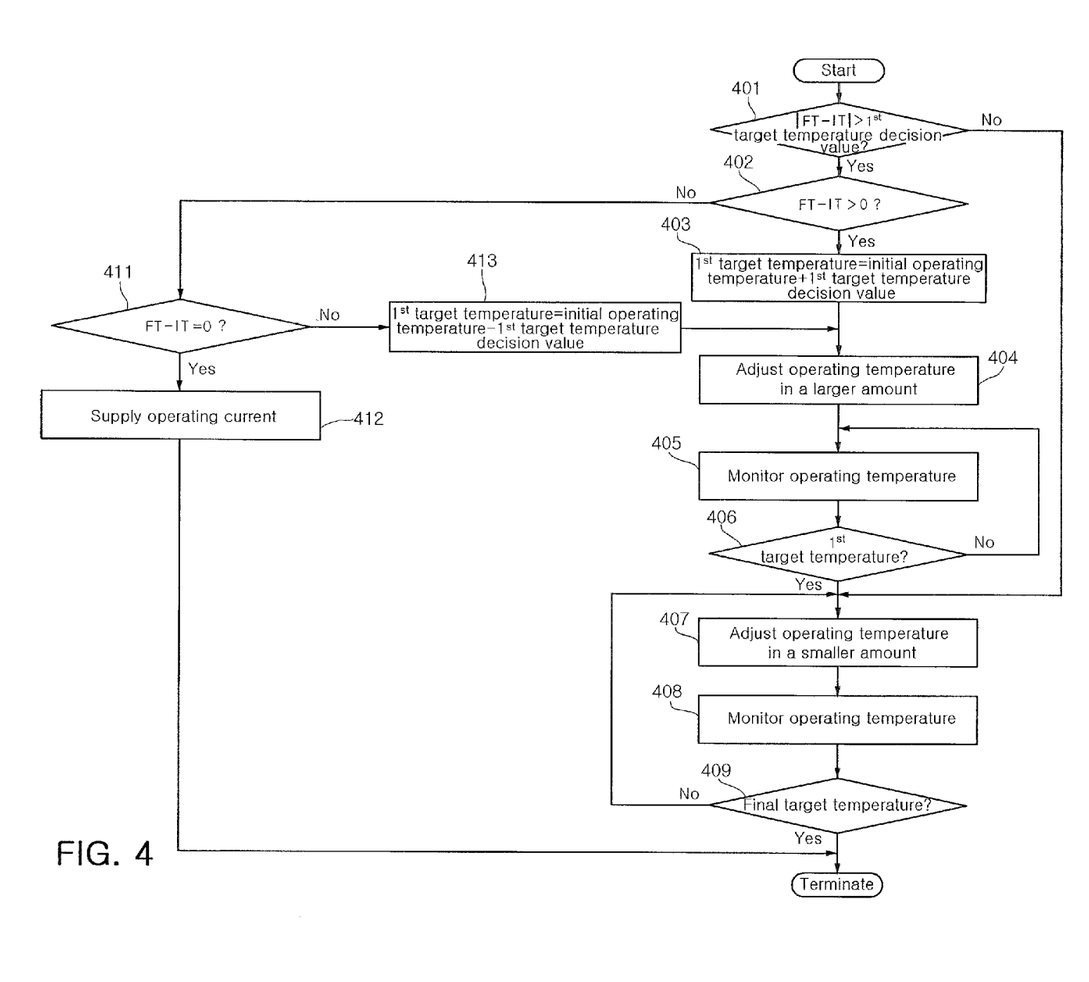
FIG. 4 is a flowchart illustrating a process of shortening the time from a start point of temperature change to an end point of temperature change according to an embodiment of the present invention.
Figure 5:
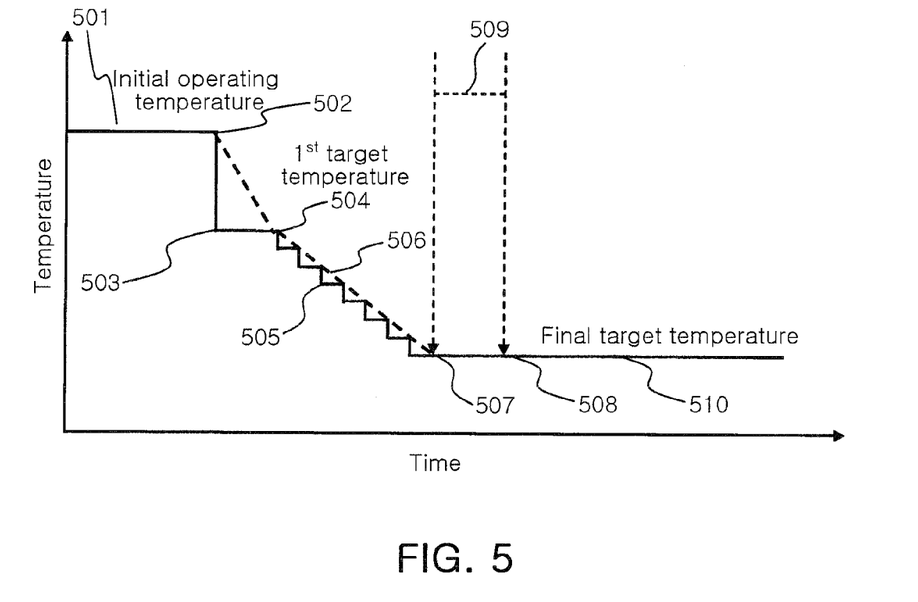
FIG. 5 is a graph illustrating control and monitoring results of the operating temperature according to time, obtained from the process of shortening the time according to an embodiment of the present invention.

FIG. 4 is a flowchart illustrating a process for shortening the time from a starting point of temperature change to an end point of temperature change according to an embodiment of the present invention, and FIG. 5 is a graph illustrating the control and monitoring results of the operating temperature according to time, obtained by shortening the wavelength tuning time according to an embodiment of the present invention.

Referring to FIGS. 4 and 5, the micro-processor 127 checks whether an absolute value of difference between the final target temperature FT 510 and the initial operating temperature IT 501 is larger than a first target temperature decision value or not. As a result, if the absolute value of difference is not larger, the process flow proceeds to step 407 and the subsequent steps after the step 407 are taken.

On the other hand, if the absolute value of difference is larger, the micro-processor 127 checks whether the value obtained by subtracting the initial operating temperature 501 from the final target temperature 510 FT-IT is larger than 0 in step 402, and if so, step 403 is executed, and if not, step 411 is executed. This can be understood as distinguishing between a larger range of temperature change and a small range of temperature change.

Therefore, the micro-processor 127 adds the initial operating temperature 501 and the first target temperature decision value to obtain a first target temperature value using added value in the step 403. Then, in step 404, the micro-processor 127 adjusts the initial operating temperature 501 in a larger amount to match the above acquired first target temperature at the point 502, and in step 405, monitors the change in the operating temperature due to the adjustment, i.e., the current operating temperature.

Then, in step 406, it is determined whether the monitored operating temperature has reached the first target temperature 503 or not. Such a function of adjusting the temperature to the first target temperature at the point 503 prevents oscillation of the wavelength of output light of the laser diode at the point of reaching the final target temperature 507 while shortening the wavelength tuning time as much as possible.

As a result, if the operating temperature has reached the first target temperature 504, the micro-processor 127 adjusts the first target temperature 504 in a smaller amount toward the final target temperature and stands by for a predetermined time. Thereafter, in step 408, the micro-processor 127 checks at the point 506 whether the current operating temperature has reached the final target temperature 507 after such an adjustment in a smaller amount. As a result, if the current operating temperature has reached the final target temperature 507, the operation is terminated, and if not, the process flow goes back to the step 407 and the procedure is repeated.

In the meantime, the value obtained by subtracting the initial operating temperature 501 from the final target temperature 510 is not greater than 0 in the step 402, it is checked whether the value obtained by subtracting the initial operating temperature 501 from the final target temperature 510 is 0 or not in step 411. As a result, if the value obtained by subtracting the initial operating temperature 501 from the final target temperature 510 is 0, the micro-processor 127 controls the operating current by supplying the operating current as in step 206 in FIG. 2, and the operation is terminated.

On the other hand, if the value obtained by subtracting the initial operating temperature 501 from the final target temperature 510 is not 0, the micro-processor 127 subtracts the first target temperature decision value 504 from the initial operating temperature 501 to obtain the first target temperature value in step 413, and the process flow proceeds to the step 404 to execute the subsequent steps.

Figure 6:
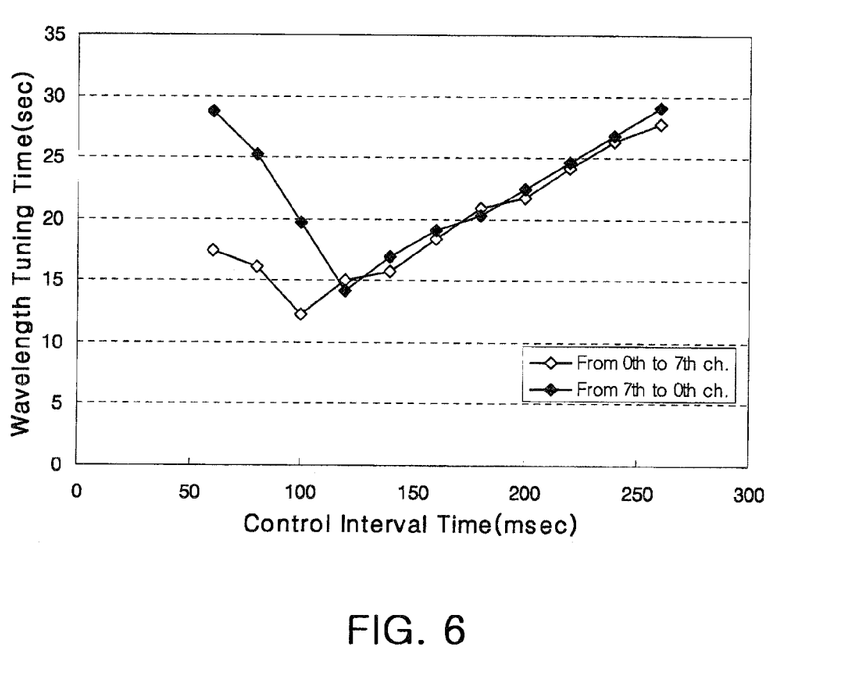
FIG. 6 is a graph illustrating characteristics of the change affecting the time from the start point to the end point of the wavelength tuning of the laser diode according to an embodiment of the present invention.

As described above, in accordance with adjustment of the control interval time for the smaller amount of temperature change (steps 407 to 409) at the step 407, the control circuit 120 adjusts the wavelength tuning time ranging from the start point 201 of the wavelength tuning of the laser diode to the end point 215 of the wavelength tuning through the micro-processor 127. The effect of adjustment of the control interval time on the wavelength tuning time is as shown in FIG. 6. That is, FIG. 6 is an experimental data of such an adjustment process, showing results of measuring the times 502 to 507 shown in FIG. 5 as the wavelength of the output light of the laser diode is shifted from the $0^{th}$ wavelength to the $7^{th}$ wavelength and from the $7^{th}$ wavelength to the $0^{th}$ wavelength.

As described above, in the process shown in FIG. 4, the control interval time is adjusted from the steps 407 to 409, and it can be perceived that rapid control and monitoring of temperature is required to shorten the wavelength tuning time (502 to 507) of the output light of the laser diode. However, due to the characteristics of a usual laser diode, as shown in FIG. 6, shortening the control interval time does not shorten the wavelength tuning time but rather results in lengthening the wavelength tuning time (from 502 to 507).

According to the present invention as set forth above, an operating temperature of a laser diode is controlled through a thermoelectric cooler of the laser diode generating an optical source by distinguishing between a larger amount of temperature change and a smaller amount of temperature change, thereby adjusting a time for controlling and monitoring the wavelength tuning. This prevents oscillation at the point of reaching a final target temperature and minimizes the time taken for wavelength tuning of the output light.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of controlling a wavelength tuning of an optical source in an optical communication system, the method comprising:
   controlling and monitoring an adjustment of an operating temperature of an optical source generator to shorten a time of a wavelength tuning of an optical source generated from the optical source generator of the optical communication system, using a first adjustment amount and a second adjustment amount of the operating temperature, the second adjustment amount smaller than the first adjustment amount;
   supplying an operating current to the optical source generator if a current operating temperature of the optical source generator reaches a final target temperature;
   controlling and monitoring the supplying of the operating current to the optical source generator; and
   halting the wavelength tuning of the optical source when the operating current reaches a final operating current.

2. A method of controlling a wavelength tuning of an optical source in an optical communication system, the method comprising:
   controlling and monitoring an adjustment of an operating temperature of an optical source generator to shorten a time of a wavelength tuning of an optical source generated from the optical source generator of the optical communication system;
   supplying an operating current to the optical source generator if a current operating temperature of the optical source generator reaches a final target temperature;
   controlling and monitoring the supplying of the operating current to the optical source generator; and
   halting the wavelength tuning of the optical source when the operating current reaches a final operating current;
   wherein the step of controlling and monitoring an adjustment of an operating temperature to shorten a time of the wavelength tuning of the optical source comprises
   adjusting an initial operating temperature of the optical source generator to a preset first target temperature by controlling and monitoring a first amount of temperature change,
   adjusting the monitored current operating temperature to the final target temperature once the initial operating temperature reaches the first target temperature by controlling and monitoring an amount of temperature change smaller than the first amount, and
   adjusting a control interval time by periodically performing the procedure of controlling and monitoring the smaller amount of temperature change.

3. The method according to claim 2, wherein the step of adjusting the initial operating temperature of the optical source generator to the preset first target temperature comprises:
   comparing an absolute value of a difference between the final target temperature and the initial operating temperature with a first target temperature decision value;
   acquiring the first target temperature if the absolute value of the difference is greater than the first target temperature decision value;
   adjusting the initial operating temperature to the acquired first target temperature; and
   checking whether the current operating temperature has reached the first target temperature by monitoring the current operating temperature.

4. The method according to claim 3, wherein the first target temperature is acquired by adding the initial operating temperature and the first target temperature decision value if a value of a difference between the final target temperature and the initial operating temperature is greater than 0.

5. The method according to claim 3, wherein the first target temperature is acquired by subtracting the first target temperature decision value from the initial operating temperature if a value of a difference between the final target temperature and the initial operating temperature is less than 0.

6. The method according to claim 2, further comprising controlling to supply the operating current to the optical source generator if a value of a difference between the final target temperature and the initial operating temperature is 0.

7. An apparatus for controlling a wavelength tuning of an optical source in an optical communication system, comprising:
   an optical source generator for generating an optical source and adjusting an operating temperature and an operating current of the optical source generator in accordance with a control signal, using a first adjustment amount and a second adjustment amount of the operating temperature, the second adjustment amount smaller than the first adjustment amount; and
   a control circuit for generating the control signal for adjusting the operating temperature and the operating current of the optical source generator, shortening a time of wavelength tuning of the optical source by monitoring the operating temperature and the operating current, and supplying the operating current to the optical source generator once a current operating temperature of the optical source generator has reached a final target temperature.

8. An apparatus for controlling a wavelength tuning of an optical source in an optical communication system, comprising:
   an optical source generator for generating an optical source and adjusting an operating temperature and an operating current of the optical source generator in accordance with a control signal; and
   a control circuit for generating the control signal for adjusting the operating temperature and the operating current of the optical source generator, shortening a time of wavelength tuning of the optical source by monitoring the operating temperature and the operating current, and supplying the operating current to the optical source generator once a current operating temperature of the optical source generator has reached a final target temperature;
   wherein the control circuit adjusts the operating temperature by distinguishing between a first range of temperature change and a range of temperature change smaller than the first range, and adjusts a control interval time by periodically controlling and monitoring the operating temperature in the smaller range of temperature change.

9. The apparatus according to claim 8, wherein the control circuit acquires a first target temperature if an absolute value of a difference between the final target temperature and an initial operating temperature is greater than a first target temperature decision value, adjusts the initial operating temperature in a first amount to the acquired first target temperature, and once the initial operating temperature has reached the first target temperature, controls and monitors to adjust the current operating temperature of the optical source generator in an amount smaller than the first amount to the final target temperature.

10. The apparatus according to claim 9, wherein the first target temperature is obtained by adding the initial operating temperature and the first target temperature decision value if a value of a difference between the final target temperature and the initial operating temperature is greater than 0, and is a value obtained by subtracting the first target temperature decision value from the initial operating temperature if the value of the difference between the final target temperature and the initial operating temperature is less than 0.

11. The apparatus according to claim 7, wherein the control circuit halts wavelength tuning of the optical source once the operating current has reached a final operating current.

12. The apparatus according to claim 7, wherein the control circuit comprises:
a temperature control block for generating the control signal for controlling the operating temperature of the optical source generator;
a temperature monitor block for monitoring the operating temperature from the optical source generator;
a current control block for generating a control signal for controlling the operating current;
a current monitor block for receiving the control signal from the current control block to monitor the operating current; and
a micro-processor for controlling a generation of the control signal to the optical source generator in accordance with the monitored operating temperature and the operating current.

13. The apparatus according to claim 12, wherein the control circuit further comprises:
a wavelength monitor block for monitoring the wavelength tuning in accordance with a signal from the optical source generator to report the a monitor result to the micro-processor; and
a power monitor block for monitoring a power in accordance with the signal from the optical source generator to report the monitor result to the micro-processor.

14. An apparatus for controlling a wavelength tuning of an optical source in an optical communication system, comprising:
an optical source generator for generating an optical source and adjusting an operating temperature and an operating current of the optical source generator in accordance with a control signal; and
a control circuit for generating the control signal for adiustinq the operating temperature and the operating current of the optical source generator, shortening a time of wavelength tuning of the optical source by monitoring the operating temperature and the operating current, and supplying the operating current to the optical source generator once a current operating temperature of the optical source generator has reached a final target temperature;
wherein the optical source generator comprises
a thermoelectric cooler for adjusting the current operating temperature in accordance with the control signal generated from the control circuit;
a thermistor for monitoring the current operating temperature adjusted by the thermoelectric cooler,
a laser diode for generating the optical source,
an etalon filter for transmitting a portion of light generated from the optical source to change an amount of light dependent on the wavelength of the optical source,
a first photo diode for converting the portion of light transmitted through the etalon filter into an electric signal, and
a second photo diode for converting a portion of light output from the laser diode into an electric signal to monitor light power of the laser diode.

* * * * *